United States Patent [19]

Tohgei

[11] 4,316,203

[45] Feb. 16, 1982

[54] INSULATED GATE FIELD EFFECT TRANSISTOR

[75] Inventor: Ryoiku Tohgei, Machida, Japan

[73] Assignee: Fujitsu Limited, Kawasaki, Japan

[21] Appl. No.: 224,197

[22] Filed: Dec. 31, 1980

Related U.S. Application Data

[63] Continuation of Ser. No. 42,493, May 24, 1979, abandoned.

[30] Foreign Application Priority Data

May 29, 1978 [JP] Japan .................................. 53-64067

[51] Int. Cl.³ .................................................. H01L 29/78
[52] U.S. Cl. .................................... 357/23; 357/55; 357/59
[58] Field of Search ............................. 357/23, 55, 59

[56] References Cited

U.S. PATENT DOCUMENTS

| | | | |
|---|---|---|---|
| 3,600,651 | 8/1971 | Duncan | 357/23 |
| 4,072,545 | 2/1978 | DeLamoneda | 357/23 |
| 4,074,301 | 2/1978 | Paivinen et al. | 357/23 |
| 4,109,270 | 8/1978 | VonBasse et al. | 357/23 |
| 4,126,881 | 11/1978 | VonBasse et al. | 357/23 |
| 4,156,289 | 5/1979 | Hoffmann et al. | 357/23 |
| 4,172,260 | 10/1979 | Okabe et al. | 357/23 |
| 4,191,963 | 3/1980 | Schmidt et al. | 357/23 |
| 4,251,828 | 2/1981 | Sakurai | 357/23 |

FOREIGN PATENT DOCUMENTS

2737134  3/1979  Fed. Rep. of Germany ........ 357/55

*Primary Examiner*—Joseph E. Clawson, Jr.

*Attorney, Agent, or Firm*—Staas & Halsey

[57] ABSTRACT

An Insulated Gate Field Effect Transistor (IG FET) comprises two depletion mode gate portions formed along the surface of a V-shaped recess in a semiconductor layer, an enhancement mode gate portion disposed between the two depletion mode gate portions, and a source region and a drain region disposed on respective sides of, and adjacent to, the depletion mode gate portion at the surface of the semiconductor layer. The V-shaped recess extends downwardly from the surface of, and through, a first semiconductor layer having comparatively low impurity concentration into an underlying second semiconductor layer having comparatively high impurity concentration. The first semiconductor layer provides, in the recess, the depletion mode gate portion, and the second semiconductor layer provides, in the recess, the enhancement mode gate portion of the IG FET. The source region and drain region are disposed on respective sides of, and adjacent to, the V-shaped recess, and are spaced apart from each other at the uppermost surface of the substrate. The IG FET, as thus described, has a very short effective channel length, but also allows easy formation of electrodes on the source and drain regions. Moreover, the described IG FET is characterized by a high punch-through voltage regardless of the polarity of the voltage applied thereto, and precludes occurrence of the short-channel effect by virtue of the provision of the two depletion mode channels adjacent to the source region and drain region, respectively. A further embodiment employing dual recesses is also disclosed.

12 Claims, 10 Drawing Figures

INSULATED GATE FIELD EFFECT TRANSISTOR

This is a continuation of application Ser. No. 042,493 filed May 24, 1979 abandoned.

BACKGROUND OF THE INVENTION

This invention relates to an improvement of an Insulated Gate Field Effect Transistor (IG FET), namely an MIS FET (Metal-Insulator-Semiconductor Field Effect Transistor).

The IG FET which is widely used as the major element of an integrated circuit preferably has high-spaced operational characteristics and a small occupation area in order to meet the requirements of a high-performance integrated circuit. In existing IG FET's, reduction in gate length or channel length resulting from curtailment of occupation area has brought about an improvement in the operation speed.

However, recently, drastic reduction of gate length causes a new problem—the so-called "short channel" effect. This effect is such that the controllability of the conductivity between the source and drain of the IG FET by the gate is lost, such loss being in the form of a decrease in the threshold level of the MIS FET.

In order to realize the normal function of an integrated circuit, this short channel effect must, of course, be eliminated. Various measures have been attempted in an effort to eliminate the short channel effect without, at the same time, losing high-speed operational characteristics.

One of the most effective measures is to employ a so-called E/D gate structure. As is well known, the E/D gate type IG FET is characterized in that the enhancement mode operational area and the depletion mode operational area are disposed in series between the source and drain areas under the single gate electrode. Such an IG FET has a channel length which is substantially shorter than that of the other IG FET's having the same electrode length (since switching speed is related to or a function of enhancement mode area), and such an IG FET also has a high speed operational characteristic. Moreover, since the distance between the source and drain areas is comparatively long due to existence of the depletion mode area, such an arrangement does not easily result in the short channel effect, and has a high punch-through voltage.

On the other hand, the E/D gate type IG FET having very short enhancement mode area often experiences difficulty in manufacturing. This is due to the fact that addition of a highly accurate masking step is generally required for adding the depletion mode operational area to the gate structure. In the usual case, the depletion mode area is formed by a process whereby an impurity is selectively injected (e.g., by ion implantation) while the enhancement mode area is masked. Thus, the manufacturing process as a whole becomes complicated and, in addition, high grade lithographic technology is required for the masking of the minute enhancement mode area.

As an example of an E/D gate type IG FET which can be manufactured without any particular additional masking step, the so-called V-type MOSFET (VMOS-)—for example, as disclosed in U.S. Pat. No. 4,003,036—is now considered. In the VMOS, the gate structure is formed along the surface of a V-shaped recess which extends into the device to such a depth as to pass through the epitaxial layer of the semiconductor substrate, and simultaneously the enhancement mode area is constituted by an interface layer which is formed by impurity diffusion into the epitaxial layer from the substrate. On the other hand, the depletion mode area is constituted by the remaining epitaxial layer. Namely, the depletion mode channel length and enhancement mode channel length are determined in accordance with the thickness of the epitaxial layer and the thickness of the interface layer formed by the impurity diffusion. As is well known, depth of impurity diffusion and thickness of the epitaxial layer can be controlled with comparative ease and with higher accuracy in the VMOS case, as compared with the lithographic case. Thus, the VMOS easily realizes a very short effective channel without need for the additional masking step and the difficult lithographic technology.

However, the VMOS mentioned above has several serious disadvantages, particularly in applications involving logic circuits. That is, in a logic circuit configuration employing an IG FET, it is generally required that the electrode wiring layer come into contact with the source region, but that is difficult to achieve in the VMOS. This is because the storage capacitor region (corresponding to the source region) is composed of a buried N+ layer formed within the semiconductor substrate. Moreover, such a VMOS exhibits a comparatively high punch-through voltage when a higher positive voltage for the buried N+ layer is applied to the N+ region disposed on the substrate surface, but exhibits a low punch-through voltage when a voltage is applied in the reverse direction.

In an application involving logic circuitry, the VMOS can be modified in such a manner that the substrate and the epitaxial layer thereon have mutually opposite conductivity types, and the substrate functions as a common source region. In such a case, the source electrode becomes unnecessary, and difficulty of formation of such an electrode can thereby be eliminated. However, configuration of such logic circuitry so that different voltages are given to several sources is not possible.

SUMMARY OF THE INVENTION

The IG FET of the present invention includes a substrate comprising a first semiconductor layer having one conductivity type, and a second semiconductor layer of the same conductivity type formed on said first layer and having a comparatively low impurity concentration. A gate is disposed on a recess which extends from the uppermost surface of, and through, the second semiconductor layer to the first semiconductor layer. The first semiconductor layer and second semiconductor layer may be formed by a single epitaxial layer on the semiconductor substrate.

As is also known with respect to the VMOS, an interface layer having an impurity concentration which is lower than that of the substrate but higher than that of the remaining layer of the epitaxial layer is formed in the epitaxial layer of low impurity concentration formed on the semiconductor substrate of the one conductivity type having high impurity concentration, such formation being by impurity diffusion from the substrate primarily at the time of the epitaxial growth step. This interface layer can be used as the first semiconductor layer, and the remaining part of the epitaxial layer which is located on the interface layer can be used as the second semiconductor layer. Instead of the latter arrangement, it is also possible to use the semiconductor substrate of one conductivity type having high impurity concentration as the first semiconductor layer, while the epitaxial layer of low impurity concentration on this substrate can be used as the second semiconductor layer.

The recess extending from the uppermost surface of the second semiconductor layer into the first semiconductor layer is terminated in the first semiconductor layer. Then, the gate insulating film and the gate electrode provided thereon are formed on the surfaces of the first and second semiconductor layers exposed in this recess. One of the other characteristics of the IG FET of the present invention is that both source and drain regions are located at the uppermost surface of the second semiconductor layer. The gate insulating film and gate electrode extend from the upper part of one side of the source region to the upper part of one side of the drain region.

The second semiconductor layer, which is adjacent to the boundary with the gate insulating film in the recess, has an impurity concentration which is adequate for inducing the depletion mode channel. The depletion mode channel, as is well known, comprises a conductive channel consisting of an inversion layer which is already induced at the semiconductor surface under the gate electrode when the bias voltage to the gate electrode is zero or of low level. For example, in the case of the typical N-channel type IG FET, wherein the second semiconductor layer is composed of P$^-$ type silicon and the gate insulating film is composed of silicon dioxide, the depletion mode channel—namely, the N$^-$ type inversion layer—can be formed without any special treatment by the well-known technique of shifting to N$^-$ type in the silicon which is adjacent to the silicon dioxide. However, it is also possible—for the purpose of forming the depletion mode channel—to introduce an impurity of the same conductivity type as that of the source and drain regions—namely, the N$^-$ type impurity in the N-channel type IG FET—into the second semiconductor layer in the recess by, for example, ion implantation. The area in which the depletion mode channel is formed is herein called the depletion mode gate portion.

The first semiconductor layer has an adequate impurity concentration for inducing an enhancement mode channel which is adjacent to the boundary with the gate insulating film in the recess. By enhancement mode channel is meant, as is well known, a conductive channel consisting of an inversion layer which is induced at the semiconductor surface under the gate electrode when the bias voltage to the gate electrode is of the same polarity as the drain voltage and exceeds the gate threshold voltage. The area wherein the enhancement mode channel is formed is herein called the enhancement mode gate portion.

In the present invention, the impurity concentration of the first semiconductor layer is set higher than that of the second semiconductor layer in order to realize coexistence of the depletion mode gate portion of the second semiconductor layer surface and the enhancement mode gate portion of the first semiconductor layer surface within the recess. Of course, the first and second semiconductor layers are of the same conductivity type, which is opposite to the conductivity type of the source and drain regions.

The source and drain regions are mutually isolated and located at the uppermost surface of the second semiconductor layer. The IG FET of the present invention has first and second depletion mode gate portions disposed adjacent to the source region and drain region, respectively, and the enhancement mode gate portion disposed between these first and second depletion mode gate portions. Namely, these three gate portions are disposed in series between the source and drain regions.

The recess which is located between the source and drain regions, and which allows disposition of each gate portion, extends from the uppermost surface of the second semiconductor layer downwardly through the second semiconductor layer to the first semiconductor layer. The length of the enhancement mode gate portion, which determines the effective channel length of the IG FET, is given by the length of the first semiconductor layer exposed in the recess extending from the one side to the other side of the source and drain regions. Therefore, the length of the enhancement mode gate portion is determined in accordance with the thickness of the second semiconductor layer and the depth and shape of the cross section of the recess. Thickness of the second semiconductor layer can be easily controlled with high accuracy—for example, through application of well-known epitaxial growth and diffusion techniques.

On the other hand, it is desirable to adapt the V-shaped recess, which is employed in the existing VMOS, in order to control the depth of the recess and the shape of the cross section. Therefore, it is desirable in the IG FET of the present invention that said recess have a V-shape in its cross section.

In the preferred embodiment of the present invention, the gate means extends along two opposite sloping sides of the V-shaped recess. The V-shaped recess can be formed easily, as is well known, by application of a selective etching technique using anisotropic etchant, including a compound such as potassium hydroxide (for example), so that the second semiconductor layer is composed of a single crystalline silicon layer having an uppermost surface of the crystallographic orientation (100). In such a case, each sloping side of the V-shaped recess is of (111) crystallographic orientation, and the angle formed by the opposite sloping sides is constant. For this reason, the depth of the V-shaped recess is determined by the aperture size of the mask used for selective etching, and can be controlled with excellent accuracy so as to facilitate reproduction on a large scale. As a result, the length of the enhancement mode gate portion can be very accurately set to a very minute value in the IG FET of the present invention.

In order that the IG FET of the present invention, as a whole, be able to function as an enhancement mode transistor—which is necessary in order that it be a functional element of a logic circuit—the two depletion mode gate portions adjacent to the source and drain regions must be completely isolated and spaced apart from each other. Considering the recess from this viewpoint, it is desirable that the recess have an edge shape instead of an inverse pyramidal shape, in contrast to the VMOS disclosed in U.S. Pat. No. 4,003,036. Moreover, it is also desirable to avoid the phenomenon whereby the inversion layer—which is likely to be induced at the surface of the P-type second semiconductor layer—connects the source and drain regions. Therefore, a so-called channel stopper (namely, an area at the surface wherein impurities having a conductivity type opposite to that of the source and drain regions are introduced in high concentration) is provided in the area between elements, namely, in the field area.

One of the advantages of the IG FET of the present invention is that both source and drain regions are located at the uppermost surface of the second semiconductor layer, even though the IG FET has a structure and advantages similar to those of the VMOS. According to this structure, as in the case of the conventional planar type IG FET, the source electrode and drain electrode are arranged so as to contact the source and drain regions, respectively, at the uppermost surface of the device. This means that there is no particular difficulty in forming the source and drain electrodes during the process of manufacturing the IG FET. In addition, the IG FET of the present invention is compatible not only with the conventional planar type IG FET, but also with the existing VMOS when it is utilized or implemented in an integrated circuit. For example, the IG FET of the present invention is capable of coexisting in an integrated circuit with the VMOS memory device disclosed in the aforementioned U.S. Pat. No. 4,003,036 without any particular disadvantages relating to the structure or manufacturing process thereof. For this reason, the IG FET of the present invention is also very effective as a functional element for configuring peripheral logic circuits of the VMOS memory device.

One of the other advantages of the IG FET of the present invention relates to the two depletion mode gate portions which are adjacent to the source region and drain region, respectively. Due to the existence of these two depletion mode gate portions, a comparatively high punch-through voltage can be secured, regardless of the polarity of the voltage applied between the source and drain regions. Consequently, the IG FET of the present invention does not experience malfunctioning due to the short channel effect, regardless of the type of logic circuit in which it is used.

In accordance with the present invention, an IG FET structure having a buried insulating film—as disclosed in copending U.S. Patent Application Ser. No. 912,736—can also be adopted. In this case, an insulating film having an aperture is formed at the surface of the semiconductor substrate having a conductivity type of high impurity concentration, while an epitaxial layer of a conductivity type having low impurity concentration is formed on the substrate surface in the aperture, and a polycrystalline semiconductor layer is formed on the insulating film. An interface layer (as explained previously) is formed in the area adjacent to the substrate in the epitaxial layer, and the IG FET of the present invention, having a recess (which is also explained above), is formed on this epitaxial layer.

In such an embodiment, the source and drain regions are provided adjacent to the buried insulating film, and thereby adjacent to the area of the PN junction, so that the parasitic capacitance therein is reduced. The polycrystalline semiconductor layer which is adjacent to the source and drain regions and extending to the buried insulating film can serve as a wiring layer. The recess for configuring the IG FET of the present invention can be formed not only on the epitaxial layer, but also on the substrate surface just under the epitaxial layer. Development of such a structure ensures a further improved high-speed operation of the IG FET of the present invention.

Thus, it is an object of the present invention to offer an improved IG FET which ensures high-speed operation.

It is another object of the present invention to offer an IG FET which can be manufactured easily without highly sophisticated lithographic technology, while eliminating the short channel effect but at the same time having a very short effective channel.

It is another object of the present invention to offer an improved E/D gate type IG FET which can be manufactured easily.

It is a further object of the present invention to offer an E/D gate type IG FET which has both a source region and a drain region on the surface of the semiconductor substrate, and which is thereby effective as an element for configuring a logic circuit.

It is another object of the present invention to offer an E/D gate type IG FET which has a high punch-through voltage for the voltage applied in any direction between the source and drain regions, and which is thereby effective as an element for a logic circuit.

It is a still further object of the present invention to offer an E/D gate type IG FET which can be used together with the existing VMOS in an integrated circuit, and which is effective as an element of a logic circuit.

Still further characteristics, advantages and objects of the present invention will become apparent from the detailed description of the preferred embodiments below, with reference to the various drawings, but it is to be understood that the present invention is not limited in scope only to such embodiments.

DETAILED DESCRIPTION OF THE EMBODIMENTS

Figure 1:
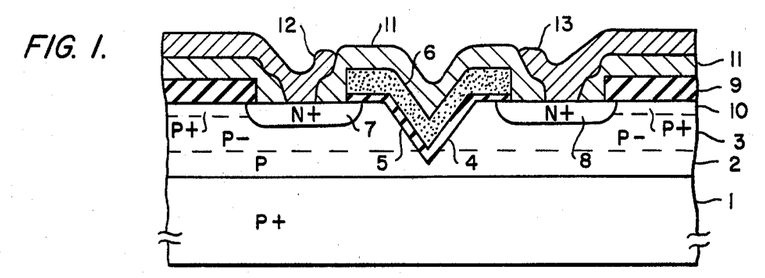
FIG. 1 is a cross-section of one embodiment of the IG FET of the present invention.

FIG. 1 is a cross-section of one embodiment of the IG FET of the present invention. The basic IG FET structure includes a P+ type silicon substrate 1 having a major surface of crystallographic planar orientation (100), and including a P− type impurity of high concentration. An epitaxial silicon layer is formed thereon. Originally, the epitaxial silicon layer includes the P− type impurity in low concentration, but there takes place formation of a P− type interface layer 2, including a P− type impurity having a concentration which is lower than that of the P+ type silicon substrate 1, but higher than that of the P− type epitaxial layer 3. This is accomplished through the diffusion of the P− type impurity from the P+ silicon substrate 1 due to the heat accompanied with the epitaxial growth process. Therefore, the epitaxial layer is composed of the P− type interface layer 2 and remaining P− type layer 3. Alternatively the epitaxial layer 3 can be an intrinsic type. The major surface of the layer 3 has a crystallographic planar orientation (100), as is the case with the silicon substrate 1.

On the epitaxial layer, the recess 4 which is V-shaped in cross section is formed. This recess 4 extends from the uppermost surface of the P− type layer 3 through the P⁻ type layer 3, and terminates in the interface layer 2. The respective surfaces of the two opposite sloping sides of this recess 4 have a crystallographic planar orientation (111). At the surface of this recess 4, the gate insulating film 5 (consisting of silicon dioxide) and the gate electrode 6 (consisting of polycrystalline silicon) are formed. The gate insulating film 5 and gate electrode 6 are located at the uppermost surface of the P⁻ type layer 3, and extend from one side to the other between the N⁺ type source region 7 and the N⁺ type drain region 8, which regions are spaced apart from each other. The IG FET element area, consisting of the source and drain regions and the gate, is surrounded by the comparatively thick field insulating film 9 (consisting of silicon dioxide). At the surface of the P⁻ layer 3, under the field insulating film 9, a channel stopper 10 having comparatively high impurity concentration is formed. Moreover, an insulating film 11 is provided on the substrate, and then aluminum electrodes 12, 13—which are in contact with the source region 7 and drain region 8, respectively, through electrode windows—are also formed on this insulating film.

At the boundary adjacent to the gate insulating film 5 of the P⁻ type layer 3, the depletion mode channels are provided. The depletion mode channels are formed on the area of the surface of the P⁻ type layer 3 and extending to the P⁻ type interface layer 2 adjacent to the source region 7 and adjacent to the drain region 8, respectively. The enhancement mode channel can be induced at the surface of the interface layer 2 in the recess 4, and connects said two depletion mode channels.

Figure 2:
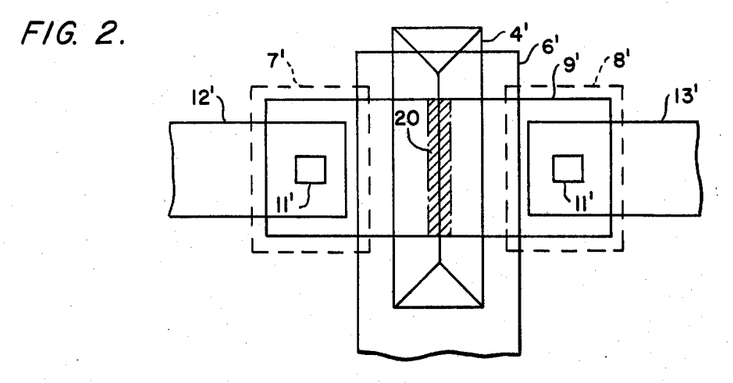
FIG. 2 is a schematic plane view of the IG FET shown in FIG. 1.

The structure of the first embodiment of the IG FET of the present invention will be more easily understood by reference to the schematic plane view shown in FIG. 2. The V-shaped recess 4' is formed crossing the aperture 9' of the field insulating film and has the form of a knife edge. At the epitaxial layer surface in the area outside the aperture 9', namely at the area of said epitaxial layer surface adjacent to the field insulating film 9 (FIG. 1), there exists the channel stopper region which precludes induction of an N⁻ type channel therein. The gate electrode 6' covers the recess 4' and extends between the source region 7' and drain region 8', thus crossing the aperture 9' in the field insulating film 9 (FIG. 1). The source electrode 12' and drain electrode 13' come into contact with the source region 7' and drain region 8', respectively, through the apertures 11' in the insulating film 11 (FIG. 1). In this manner, conductivity between the source and drain can be effectively controlled by the enhancement mode channel portion 20.

The process of manufacturing the IG FET shown in FIGS. 1 and 2 will now be explained by reference to FIGS. 3 through 8.

Figure 3:
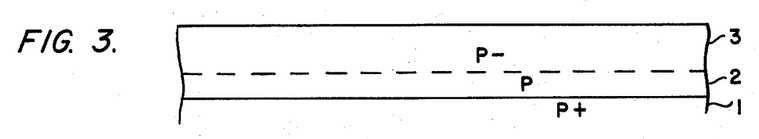
FIGS. 3 through 8 are cross-sections of the IG FET embodiment of FIGS. 1 and 2, shown during various stages in the manufacturing process thereof, in accordance with the present invention.

Firstly, with reference to FIG. 3, a P⁻ type silicon epitaxial growth treatment is performed on the P⁺ type (100) silicon substrate 1 by well-known technology—for example, the thermal decomposition method of monosilane (SiH₄). Then, an out-diffusion of P⁻ type impurity from the P⁺ type silicon substrate 1 occurs under a temperature of about 1050° C. resulting from the epitaxial growth treatment, and the P⁻ type interface layer 2 is formed at the boundary region between the P⁺ type substrate 1 and the P⁻ type epitaxial layer 3. The P⁻ type interface layer 2 thus formed has an impurity concentration lower than that of the P⁺ substrate 1, but higher than that of the P⁻ type epitaxial layer 3. For example, an impurity concentration of the P⁺ substrate 1 is about $3 \times 10^{17}$ cm⁻³, while that of the P⁻ type epitaxial layer 3 is about $5 \times 10^{14}$ cm⁻³. Moreover, the thickness of the P⁻ type epitaxial layer is 2 μm (for example). In the preferred embodiment, the impurity which determines the conductivity type of the P⁺ type substrate 1 is boron, and the P⁻ type interface layer 2 has a thickness of about 0.3 μm and a substantial boron concentration of about $10^{16}$ cm⁻³.

Figure 4:
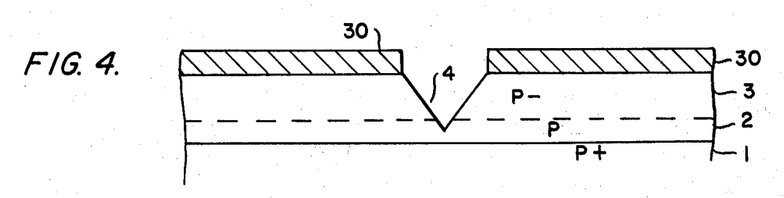

As shown in FIG. 4, the recess 4 which is V-shaped in cross section is formed by an etching process using a masking film 30 (such as a photoresist film) through application of an anisotropic etchant including potassium hydroxide. Since the etching rate becomes very low after exposure of the (111) crystallographic plane in the recess 4, the depth of the recess 4 is substantially determined by the width of the aperture of the masking film 30. In this preferred embodiment, the depth of the recess 4 is about 1.5 μm.

Figure 5:
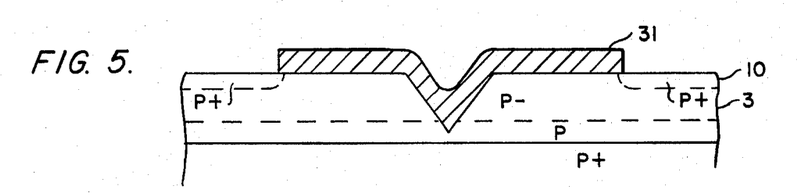

With reference to FIG. 5, after removal of the masking film 30, a new masking film 31 should be formed to cover the area on which the IG FET is to be formed on the epitaxial layer 3. Thereafter, boron ions are injected into the surface of epitaxial layer 3, and the P⁺ type channel stopper regions 10 having high impurity concentration are formed. Desirably, the masking film 31 should be an oxidation-preventing film (such as silicon nitride) and it should have the same pattern as the aperture of the field insulating film which is to be formed later (as discussed below).

Figure 6:
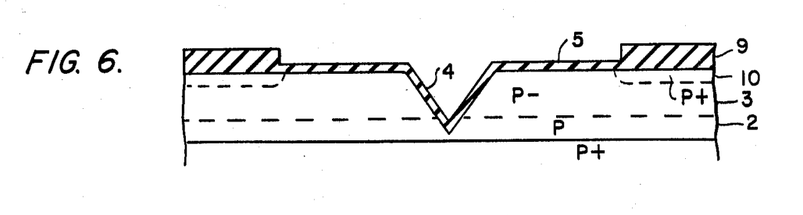

With reference to FIG. 6, a silicon dioxide field insulating film 9 is formed on that area of the epitaxial layer 3 not masked by the masking film 31. Such field insulating film is formed (for example) by a method such as thermal oxidation. After removal of the masking film 31, a gate insulating film 5 (also consisting of silicon dioxide) is formed in the aperture between adjacent portions of the field insulating film 9, such formation taking place by a method such as thermal oxidation, as explained above. As a result, the field insulating film 9 is formed with substantially the same pattern as the channel stopper 10.

In this step, ion implantation may be performed in order to inject a conductivity type modifying impurity into the surface of the epitaxial layer 2/interface layer 3 through the gate insulating film 5. Therefore, the value of the impurity concentration itself of the epitaxial layer 2/interface layer 3 is not so critical. However, the difference of the impurity concentrations therein is important in accordance with the present invention.

Figure 7:
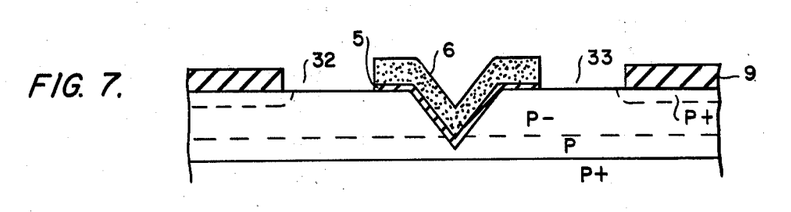

The substrate is then coated with polycrystalline silicon by a well-known method (such as thermal decomposition of monosilane (SiH₄)). Thereafter, the polycrystalline silicon layer 6 and the gate insulating film 5 are formed in the shape of the gate by photolithographic techniques, as shown in FIG. 7. Thus, the gate electrode 6 consisting of polycrystalline silicon is formed, and this is followed by formation of apertures 32 and 33 so as to define the source and drain regions of the IG FET.

Figure 8:
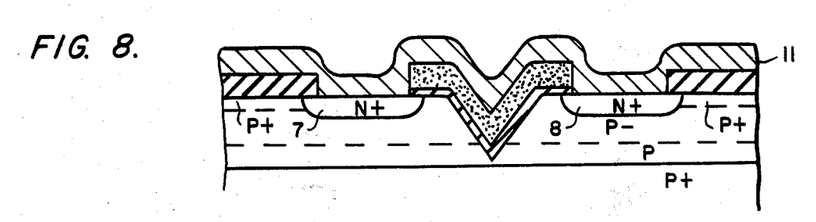

As shown in FIG. 8, a phophorus silicate glass film 11 is coated on the substrate, and the substrate is then heated to a diffusion temperature. Thereby, the phosphor is diffused from the glass film 11 into the adjacent epitaxial layer 3. Thus, N⁺ type source region 7 and N⁺ type drain region 8 are formed. As a result of such a series of thermal processes, the P⁻ type interface layer 2 (discussed above) develops into a thickness of about 0.5 to 0.7 μm, and the recess 4 terminates in the first semiconductor layer—that is, the P⁻ type interface layer 2. Respective electrode windows are then formed above the source region 7 and drain region 8 in the glass film 11, an aluminum coating is applied, and the aluminum film thus applied is patterned. Thus, the source electrode 12 and drain electrode 13 are formed as shown in FIG. 1, completing the IG FET shown in FIG. 1.

As will be understood from the above-mentioned example of the manufacturing process, the IG FET of the present invention is substantially compatible with the VMOS memory cell disclosed in U.S. Pat. No. 4,033,036. In the above manufacturing process, the completed IG FET may have the functions of the VMOS memory cell if the N+ diffusion region, which should become the buried N+ layer, is formed at the surface of the P⁻ type silicon substrate 1 prior to the epitaxial growth process shown in FIG. 3. In this case, the depth of the recess 4, which should reach the buried N+ layer, can be flexibly controlled by changing the size of the aperture of the masking film 30 shown in FIG. 4. Therefore, the IG FET of the present invention is also effective as an active element for the peripheral control circuit which is required in a VMOS memory device.

Figure 9:
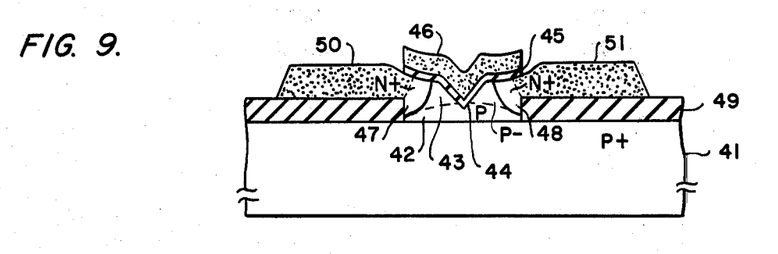
FIG. 9 is a cross-section of another embodiment of the IG FET of the present invention.

Another embodiment of the IG FET of the present invention is shown in FIG. 9. In this embodiment, a buried insulating film 49 is provided in correspondence to the field insulating film 9 in the embodiment of FIG. 1. In the aperture of the buried insulating film 49, an epitaxial layer consisting of a P⁻ type interface layer 42 disposed between a P+ type silicon substrate 41 and a P⁻ type or intrinsic layer 43 is formed. The relation between the layers 42 and 43, and the impurity concentration of the substrate 41, may be the same as that in the embodiment of FIG. 1. The source region 47 and drain region 48 reach the buried insulating film 49 from the surface of the P⁻ type layer 43 at respective end portions of the epitaxial layer. When the source region 47 and drain region 48 are disposed adjacent to the buried insulating film 49, parasitic junction capacitance can be reduced drastically. The N⁻ type polycrystalline silicon layers 50 and 51 are located adjacent to the source region 47 and drain region 48, respectively, and extend over the buried insulating film 49. These polycrystalline layers 50 and 51 are formed on the insulating film 49 during the epitaxial growth treatment for the layers 42 and 43. The N⁻ type impurity for the formation of the source region 47 and drain region 48 may be introduced into the polycrystalline layers 50 and 51, and can be used as the electrical leads for the source and drain, respectively.

This embodiment of the IG FET can be manufactured by a process such as the manufacturing process described above with reference to FIGS. 3 through 8, the insulating film 49 which is equivalent to the field insulating film 6 shown in FIG. 6 being formed on the surface of the P+ type silicon substrate 1 prior to the epitaxial growth process in FIG. 3. However, since the buried insulating film 49 is disposed adjacent to the P+ type silicon substrate 41 having high impurity concentration, the employment or provision of a channel stopper is unnecessary. The structure and pattern of the V-shaped recess 44, the gate insulating film 45 and the gate electrode 46 may be substantially the same as shown in FIGS. 1 and 2.

Figure 10:
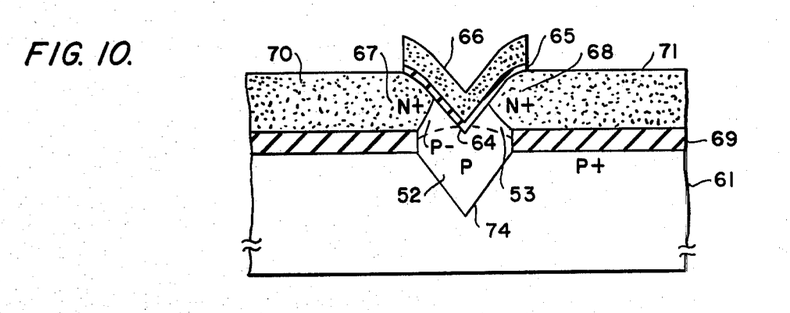
FIG. 10 is a cross-section of still another embodiment of the IG FET of the present invention.

FIG. 10 shows another embodiment of the IG FET of the present invention. The IG FET of this embodiment is so characterized that a second V-shaped recess 74 is formed on the surface of the P+ type silicon substrate 61, in addition to a first V-shaped recess 64 which corresponds to the recess 44 of the IG FET embodiment shown in FIG. 9. The second V-shaped recess 74 is located in the aperture of the buried insulating film 69, and may be formed by anisotropic etching of the silicon substrate 61 using the insulating film 69 as the mask. The first V-shaped recess 64 is formed at the surface of the epitaxial layers 52 and 53, just above the second V-shaped recess 74. The characteristics and structure of the gate insulating film 65, gate electrode 66, source region 67, drain region 68 and the N-type polycrystalline silicon layers 70 and 71 (forming electrical leads for the first V-shaped recess 64) are substantially the same as the characteristics and structure of the corresponding elements of the IG FET embodiment of FIG. 9.

The IG FET embodiments shown in FIGS. 9 and 10 have the advantage that they have small source and drain junction capacitances, and thereby they are suitable for further high-speed operation. They also have the other advantages (described above) characterizing the IG FET embodiments of FIGS. 1 and 2.

Numerous modifications and adaptations of the system of the invention will be apparent to those skilled in the art and thus it is intended by the appended claims to cover all such modifications and adaptations which fall within the true spirit and scope of the invention.

I claim:
1. An insulated gate field effect transistor, comprising:
   a substrate including a first semiconductor layer of a first conductivity type and having a first impurity concentration, said first semiconductor layer having an uppermost surface, and a second semiconductor layer disposed on said surface of said first semiconductor layer and having a second impurity concentration of the same conductivity type as said first impurity concentration, said second semiconductor layer having an uppermost surface, said first impurity concentration being higher than said second impurity concentration,
   a source region and a drain region, each of a second conductivity type opposite to said first conductivity type, said source region and said drain region being spaced apart from each other and respectively located at said uppermost surface of said second semiconductor layer,
   said substrate having a recess extending downwardly from said uppermost surface of said second semiconductor layer through said second semiconductor layer into and terminating at a point within said first semiconductor layer, said recess separating said source and drain regions and exposing portions of said first and second semiconductor layers,
   a gate region extending between said source region and said drain region on said uppermost surface of said second semiconductor layer and on said exposed portions of said first and second semiconductor layers, said gate region comprising first and second depletion mode gate portions located in said second semiconductor layer adjacent to said source region and said drain region, respectively, and an enhancement mode gate portion located in said first semiconductor layer between said first and second depletion mode gate portions and adja- cent thereto, said enhancement mode gate portion comprising said terminating point of said recess in said first semiconductor layer.

2. The insulated gate field effect transistor of claim 1, further comprising first and second conductive contacts connected to said source region and said drain region, respectively, at said uppermost surface of said second semiconductor layer.

3. The insulated gate field effect transistor of claim 1, wherein said recess is V-shaped in cross section.

4. The insulated gate field effect transistor of claim 1, wherein said recess is V-shaped in cross section and has two opposite sloping sides, said gate region extending along said two opposite sloping sides of said recess.

5. An insulated gate field effect transistor, comprising:
   a semiconductor substrate of a first conductivity type,
   an epitaxial layer of said first conductivity type disposed on the surface of said substrate, said epitaxial layer comprising (1) a first semiconductor layer of a first impurity concentration of said first conductivity type located on the surface of said semiconductor substrate, and (2) a second semiconductor layer with a second impurity concentration of said first conductivity type disposed on said first layer, said first impurity concentration of said first layer being lower than the impurity concentration of said substrate and higher than said second impurity concentration of said second layer,
   a source region and a drain region of a second conductivity type opposite to said first conductivity type, said source region and said drain region being spaced apart from each other and respectively located at the uppermost surface of said second semiconductor layer,
   said epitaxial layer having a recess formed therein so as to extend downwardly from said uppermost surface of said second semiconductor layer through said second semiconductor layer into said first semiconductor layer and terminating at a point within said first semiconductor layer, said recess separating said source and drain regions, and
   a gate region extending between said source region and said drain region, and comprising first and second depletion mode gate portions and an enhancement mode gate portion, said first depletion mode gate portion and said second depletion mode gate portion being located in said second semiconductor layer and adjacent to said source region and said drain region, respectively, and said enhancement mode gate portion being located in said first semiconductor layer and connected between said first depletion mode gate portion and said second depletion mode gate portion, said terminating point of said recess being comprised in said enhancement mode gate portion, and
   a respective conductive contact connected to each said source region and drain region and selectively disposed over the surface of said second semiconductor layer.

6. The insulated gate field effect transistor of claim 5, wherein said recess is V-shaped in cross section.

7. An insulated gate field effect transistor, comprising:
   a semiconductor substrate of a first conductivity type having an uppermost surface and an impurity concentration corresponding to a first conductivity type,
   an insulating film covering said uppermost surface of said semiconductor substrate, said insulating film being discontinuous so as to form an aperture therein,
   an epitaxial layer selectively formed on said uppermost surface of said substrate within said aperture, said epitaxial layer comprising (1) a first layer disposed on said uppermost surface of said semiconductor substrate and having said first conductivity type and having an uppermost surface, said first layer having an impurity concentration such that the conductivity of said first layer is lower than the conductivity corresponding to said impurity concentration of said semiconductor substrate, and (2) a second layer of said first conductivity type disposed on said uppermost surface of said first layer and having an uppermost layer, said second layer having an impurity concentration which is lower than said impurity concentration of said first layer, said epitaxial layer having a recess formed therein,
   a source region and a drain region, each of a second conductivity type opposite to said first type, said source region and said drain region being spaced apart from each other and located at said uppermost surface of said second layer, said source region and said drain region further extending to said insulating film,
   at least one polycrystalline semiconductor layer extending from at least one of said source and drain regions and over said insulating film, each said polycrystalline semiconductor layer being of said second conductivity type, and
   a gate region located in said recess in said epitaxial layer within said aperture, said recess extending downwardly from said uppermost surface of said second layer through said second layer into said first layer, said gate region extending between said source region and said drain region and comprising first and second depletion mode gate portions and an enhancement mode gate portion, said first depletion mode gate portion and said second depletion mode gate portion being located within said second layer and adjacent to said source region and said drain region, respectively, and said enhancement mode gate portion being located within said first layer and between said first and second depletion mode gate portions.

8. The insulated gate field effect transistor of claim 7, wherein said recess is V-shaped in cross section and terminates within said first layer.

9. An insulated gate field effect transistor, comprising:
   a semiconductor substrate of a first conductivity type having an uppermost surface and an impurity concentration corresponding to said first conductivity type, said substrate having a first recess formed in said uppermost surface of said semiconductor substrate extending downwardly from the uppermost surface of said substrate,
   an insulating film covering the uppermost surface of said substrate, said insulating film being discontinuous to form an aperture therein so as to expose said first recess,
   an epitaxial layer formed selectively over said insulating film and in said first recess of said substrate within said aperture, said epitaxial layer comprising a first layer and a second layer, said first layer being of said first conductivity type, said first layer being located between said substrate and said second layer, said first layer having a respective first impurity concentration corresponding to said first conductivity type, and said second layer having a respective second impurity concentration of said first conductivity type, said first impurity concentration being lower than said impurity concentration of said semiconductor substrate and higher than said second impurity concentration, a source region and a drain region of a second conductivity type opposite to said first conductivity type, said source region and said drain region being spaced apart from each other and located at the uppermost surface of said second layer, said source region and said drain region further extending to said insulating film, a polycrystalline semiconductor layer extending from at least one of said source and drain regions over said insulating film, said polycrystalline layer being of said second conductivity type, and said epitaxial layer having a second recess located directly above said first recess and extending downwardly from said uppermost surface of said second layer through said second layer into said first layer, said gate region extending between said source region and said drain region and comprising first and second depletion mode gate portions and an enhancement mode gate portion, said first depletion mode gate portion and said second depletion mode gate portion being located on said second layer within said second recess and adjacent to said source region and said drain region, respectively, and said enhancement mode gate portion being located on said first layer and connected between said first and second depletion mode gate portions.

10. The insulated gate field effect transistor of claim 9, wherein each of said first recess and said second recess is V-shaped in cross section.

11. The transistor of claim 7 or 9, said impurity concentration of said second layer being sufficiently low to cause the conductivity of said second semiconductor layer to have an intrinsic type conductivity.

12. The transistor of claim 1, 4, 5 or 6, said impurity concentration of said second layer being sufficiently low to cause the conductivity of said second semiconductor layer to have an intrinsic type conductivity.

* * * * *

UNITED STATES PATENT AND TRADEMARK OFFICE
CERTIFICATE OF CORRECTION

PATENT NO. : 4,316,203
DATED : Feb. 16, 1982
INVENTOR(S) : Tohgei

It is certified that error appears in the above—identified patent and that said Letters Patent is hereby corrected as shown below:

Column 9, line 14, "4,033,036" should be --4,003,036--;
line 35, "type or intrinsic" should be
--or intrinsic type--.

Signed and Sealed this

Twentieth Day of July 1982

[SEAL]

Attest:

GERALD J. MOSSINGHOFF

*Attesting Officer*     *Commissioner of Patents and Trademarks*